(12) United States Patent
Edwards et al.

(10) Patent No.: US 9,555,595 B2
(45) Date of Patent: Jan. 31, 2017

(54) MULTI-LAMINATE HERMETIC BARRIERS AND RELATED STRUCTURES AND METHODS OF HERMETIC SEALING

(71) Applicant: CORNING INCORPORATED, Corning, NY (US)

(72) Inventors: Victoria Ann Edwards, Horseheads, NY (US); Cynthia Baker Giroux, Corning, NY (US); Shari Elizabeth Koval, Beaver Dreams, NY (US); Mark Alejandro Quesada, Horseheads, NY (US); Wanda Janina Walczak, Big Flats, NY (US)

(*) Notice: Subject to any disclaimer, the term of this patent is extended or adjusted under 35 U.S.C. 154(b) by 83 days.

(21) Appl. No.: 14/032,663

(22) Filed: Sep. 20, 2013

(65) Prior Publication Data

US 2014/0017437 A1    Jan. 16, 2014

Related U.S. Application Data

(62) Division of application No. 12/763,541, filed on Apr. 20, 2010, now Pat. No. 8,563,113.

(51) Int. Cl.
| | | |
|---|---|---|
| *B32B 3/04* | (2006.01) | |
| *B32B 27/32* | (2006.01) | |
| *B32B 27/36* | (2006.01) | |
| *H01L 51/52* | (2006.01) | |

(52) U.S. Cl.
CPC ............. *B32B 3/04* (2013.01); *B32B 27/32* (2013.01); *B32B 27/36* (2013.01); *H01L 51/524* (2013.01); *H01L 51/5237* (2013.01); *H01L 51/5246* (2013.01); *H01L 51/5256* (2013.01); *B32B 2255/20* (2013.01); *B32B 2367/00* (2013.01); *Y10T 156/10* (2015.01); *Y10T 428/231* (2015.01); *Y10T 428/239* (2015.01); *Y10T 428/24* (2015.01); *Y10T 428/249921* (2015.04);

(Continued)

(58) Field of Classification Search
CPC ................................ Y10T 428/24; B32B 3/28
USPC .......................................... 428/98
See application file for complete search history.

(56) References Cited

U.S. PATENT DOCUMENTS

| | | | |
|---|---|---|---|
| 5,089,446 A | 2/1992 | Cornelius et al. | |
| 5,888,648 A | 3/1999 | Donovan et al. | ............. 428/349 |
| 7,108,816 B2 | 9/2006 | Winmberger-Friedl et al. | |

(Continued)

FOREIGN PATENT DOCUMENTS

| | | |
|---|---|---|
| CN | 1348609 | 5/2002 |
| CN | 1678639 | 10/2005 |

(Continued)

OTHER PUBLICATIONS

Lewis, et al., "Thin-Film Permeation-Barrier Technology for Flexible Organic Light-Emitting Devices", IEEE Journal of Selected Topics in Quantum Electronics, vol. 10, No. 1, 2004, pp. 45-57.

(Continued)

*Primary Examiner* — Brent O'Hern

(57) ABSTRACT

A free-standing multi-laminate hermetic sheet includes a first carrier film, a hermetic inorganic thin film formed over the first carrier film, and a second carrier film formed over the hermetic inorganic thin film. A workpiece can be hermetically sealed using the multi-laminate sheet, which can be applied to the workpiece in a step separate from a formation step of either the multi-laminate sheet or the workpiece.

10 Claims, 4 Drawing Sheets

(52) U.S. Cl.
CPC ..... *Y10T 428/263* (2015.01); *Y10T 428/31663* (2015.04); *Y10T 428/31786* (2015.04)

(56) References Cited

U.S. PATENT DOCUMENTS

| | | | |
|---|---|---|---|
| 7,722,929 | B2 | 5/2010 | Aitken et al. |
| 7,829,147 | B2 | 11/2010 | Aitken et al. |
| 8,142,260 | B2 | 3/2012 | Kollata et al. |
| 8,304,990 | B2 | 11/2012 | Aitken et al. |
| 8,435,604 | B2 | 5/2013 | Aitken et al. |
| 9,050,622 | B2 | 6/2015 | Aitken et al. |
| 2002/0125822 | A1 | 9/2002 | Graff et al. .................... 313/506 |
| 2003/0207488 | A1 | 11/2003 | Carcia et al. |
| 2005/0014022 | A1 | 1/2005 | Park |
| 2005/0093001 | A1 | 5/2005 | Liu et al. ......................... 257/79 |
| 2006/0028128 | A1 | 2/2006 | Ohkubo |
| 2006/0100299 | A1 | 5/2006 | Malik et al. |
| 2008/0048178 | A1* | 2/2008 | Aitken .................... C23C 14/06 257/40 |
| 2008/0290798 | A1 | 11/2008 | Quesada |
| 2008/0314502 | A1 | 12/2008 | Ok et al. |
| 2009/0022981 | A1 | 1/2009 | Yoshida et al. |
| 2010/0109516 | A1 | 5/2010 | Warashina et al. ........... 313/504 |
| 2013/0164497 | A1 | 6/2013 | Okamura et al. |

FOREIGN PATENT DOCUMENTS

| | | |
|---|---|---|
| EP | 2 157 832 A1 | 2/2010 |
| JP | 2000-357811 A | 12/2000 |
| JP | 2002-543563 A | 12/2001 |
| JP | 2004-165512 A | 6/2004 |
| JP | 2004-244606 A | 9/2004 |
| JP | 2005-516369 A | 6/2005 |
| JP | 2006-289627 A | 10/2006 |
| TW | 439308 | 6/2001 |
| WO | 00-36665 A1 | 6/2000 |
| WO | 00/65670 | 11/2000 |
| WO | 2003/065470 A1 | 8/2003 |
| WO | 2008/069930 | 6/2008 ............. H01L 51/52 |

OTHER PUBLICATIONS

Lewis, et al., Thin-Film Permeation-Barrier Technology for Flexible Organic Light-Emitting Devices, *IEEE Journal of Selected Topics in Quantum Electronics*, vol. 10, No. 1, Jan./Feb. 2004, pp. 45-57.
CN201180019944.8 First Office Action Dated Jan. 9, 2015.
CN201180019944.8 Third Office Action Dated Mar. 30, 2016.
CN201510008911.3 First Office Action Dated Mar. 1, 2016.
International Search Report of the International Searching Authority; PCT/US2011/032389; Mailed Dec. 2, 2011.
JP2013506179 Decision of Rejection Dated Dec. 1, 2015.
KR1020127029637 Office Action Dated Feb. 24, 2016.
TW100112360 Search Report Dated Jul. 7, 2014.
TW103146343 Search Report Dated May 2, 2016.
JP2013506179 First Office Action Dated Mar. 31, 2015.

* cited by examiner

MULTI-LAMINATE HERMETIC BARRIERS AND RELATED STRUCTURES AND METHODS OF HERMETIC SEALING

CROSS REFERENCE TO RELATED APPLICATIONS

This application is a divisional application of and claims the priority benefit of U.S. patent application Ser. No. 12/763,541, filed on Apr. 20, 2010, the content of which is relied upon and incorporated herein by reference in its entirety.

BACKGROUND AND SUMMARY

The present disclosure relates generally to hermetic barrier layers, and more specifically to free-standing multi-laminate hermetic sheets, related structures, and methods of forming hermetic seals.

Hermetic barrier layers can be used to protect sensitive materials from deleterious exposure to a wide variety of liquids and gases. As used herein, "hermetic" refers to a state of being completely or substantially sealed, especially against the escape or entry of water or air, though protection from exposure to other liquids and gases is contemplated.

Approaches to creating hermetic barrier layers include physical vapor deposition (PVD) methods such as sputtering or evaporation, or chemical vapor deposition (CVD) methods such as plasma-enhanced CVD (PECVD) where a hermetic barrier layer can be formed directly on the device or material to be protected. By way of example, both reactive and non-reactive sputtering can be used to form a hermetic barrier layer, for example, under room temperature or elevated temperature processing conditions. Reactive sputtering is performed in conjunction with a reactive gas such as oxygen or nitrogen, which results in the formation of a corresponding compound barrier layer (i.e., oxide or nitride). Non-reactive sputtering can be performed using an oxide or nitride target having a desired composition in order to form a barrier layer having a similar or related composition.

In contrast with non-reactive sputtering, reactive sputtering or CVD can be economically advantageous due to comparatively higher deposition rates. However, although increased throughput can be achieved via reactive sputtering, its inherently reactive nature is generally incompatible with sensitive devices or materials that require protection.

In view of the foregoing, economical and device-compatible hermetic barrier layers that can protect sensitive workpieces such as devices, articles or raw materials from undesired exposure to oxygen, water, heat or other contaminants are highly desirable.

According to one aspect of the current disclosure, a hermetic barrier layer is provided where formation of the barrier layer is decoupled from its application to the workpiece to be protected. Formation of the hermetic barrier layer itself (e.g., via physical or chemical vapor deposition) may involve oxygen, water, solvents, elevated temperatures, ion bombardment, etc. By forming the hermetic barrier layer in a first step, and then applying the hermetic barrier layer to a workpiece in subsequent step, exposure of the workpiece to aggressive or otherwise harmful process conditions during the act of applying the hermetic barrier layer can be avoided.

The disclosure describes a free-standing multi-laminate hermetic barrier that can be configured to at least partially encapsulate a device, article or material that is sensitive to degradation by oxygen, moisture, heat, or other contaminants. A free-standing multi-laminate hermetic sheet comprises one or more inorganic thin films and one or more flexible carrier films alternately configured in a stacked geometry. In particular, a free-standing multi-laminate hermetic sheet according to one embodiment comprises a first carrier film, an inorganic thin film having opposing first and second major surfaces, and a second carrier film, wherein the first major surface of the inorganic thin film is formed over a surface of the first carrier film, and the second carrier film is formed over the second major surface of the inorganic thin film. In further embodiments, a multi-laminate gasket comprises an inorganic thin film formed over a suitable gasket member. The inorganic thin film may comprise one or more oxides or nitrides including various glass compositions, while the carrier films and gasket member can comprise flexible polymeric materials such as polydimethylsiloxane (PDMS), polyethylene-naphthalate (PEN) or polyethylene-terephthalate (PET).

A method of hermetically sealing a workpiece comprises supporting a workpiece on a substrate, forming a multi-laminate hermetic sheet, and encapsulating the workpiece by placing the hermetic sheet over the workpiece and either directly or indirectly in hermetic contact with the substrate in a region of the substrate peripheral to the workpiece.

A device that is initially formed on a surface of a substrate can be hermetically sealed using a multi-laminate sealing assembly that includes a multi-laminate hermetic sheet and a multi-laminate hermetic gasket. The multi-laminate hermetic gasket is disposed on the surface of the substrate peripheral to the device, and the multi-laminate hermetic sheet is disposed over the device and in hermetic contact with the gasket.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention and together with the description serve to explain the principles and operations of the invention.

DETAILED DESCRIPTION

A multi-laminate hermetic sheet comprises at least one carrier film and at least one inorganic thin film formed on the carrier film. The hermetic sheet may comprise a bi-layer sheet, a tri-layer sheet, or a laminate sheet having more than three layers. Example multi-laminate hermetic sheets according to various embodiments include a bi-layer oxide/PDMS hermetic sheet and a tri-layer PEN/oxide/PDMS hermetic sheet.

Figure 1:
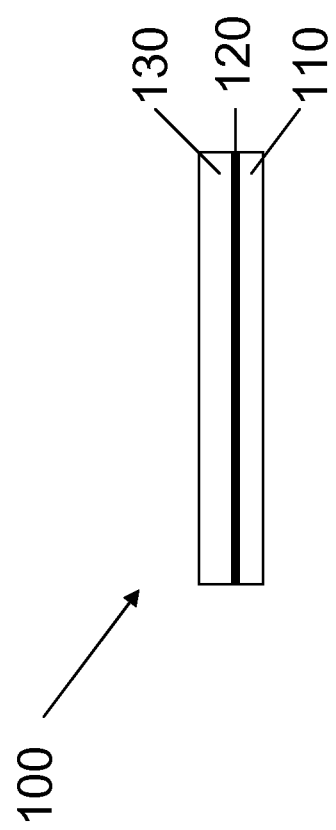
FIG. 1 is a schematic illustration of a multi-laminate hermetic sheet according to one embodiment.

A multi-laminate hermetic sheet according to one embodiment is shown schematically in FIG. 1. The multi-laminate hermetic sheet 100 comprises a first carrier film 110, a hermetic inorganic thin film 120 formed over and in direct physical contact with the first carrier film 110, and a second carrier film 130 formed over and in direct physical contact with the hermetic inorganic thin film 120. In the illustrated embodiment, the inorganic thin film 120 is sandwiched between respective carrier films 110, 130. The optional second carrier film 130 can provide protection for the inorganic thin film 120, and may be adapted to position the inorganic thin film 120 at the neutral plane or slightly in the compressive region of the multi-laminate hermetic sheet.

The carrier films can comprise plastics, polymers, or composite films including compliant (i.e., flexible) polymers such as polydimethylsiloxane (PDMS), polyethylene-naphthalate (PEN) or polyethylene-terephthalate (PET), although other materials may be suitable. The plurality of carrier films that are incorporated into the multi-laminate hermetic sheet, including the first and second carrier films, may comprise the same polymer material or different polymer materials. In an embodiment, an inorganic oxide thin film is formed on a first carrier film comprising PEN and a second carrier film of PDMS is formed over the exposed major surface of the inorganic oxide.

The hermetic inorganic thin film can include oxide or nitride materials including glass compositions such as 870CHM, which is a niobium-doped tin oxide/tin fluorophosphate/phosphorous pentoxide glass comprising about 39.6 mol % $SnF_2$, 38.7 mol % SnO, 19.9 mol % $P_2O_5$ and 1.8 mol % $Nb_2O_5$. Suitable glass compositions for the inorganic thin film(s) are disclosed in commonly-assigned U.S. Pat. No. 5,089,446 and in U.S. Pat. Application Publication Nos. 2008/0149924, 2007/0252526 and 2007/0040501, the disclosures of which are incorporated herein by reference in their entirety.

In embodiments, the multi-laminate hermetic sheet can be free-standing, i.e., un-supported by a substrate. The overall dimensions of the multi-laminate hermetic sheet can vary according to the application, but example overall thickness and area can range from about 30 to 1000 microns and from about 1 $cm^2$ to 10 $m^2$ or more, respectively. In embodiments, a thickness of the individual carrier films can range from about 15 to 500 microns (e.g., 15, 25, 40, 100, 150, 200, 400 or 500 microns), while a thickness of the hermetic inorganic thin film can range from about 0.5 to 10 microns (e.g., 0.5, 1, 2, 4, 6, 8 or 10 microns). In order to protect multi-laminate hermetic sheets prior to use (e.g., during shipping or storage), one or more sheets can be packaged in a container suitable for maintaining the hermetic integrity of the sheets. A suitable container may or may not be disposable and, in addition to protecting hermetic sheets from mechanical damage, may provide sterile storage and protection from radiation damage.

Figure 2:
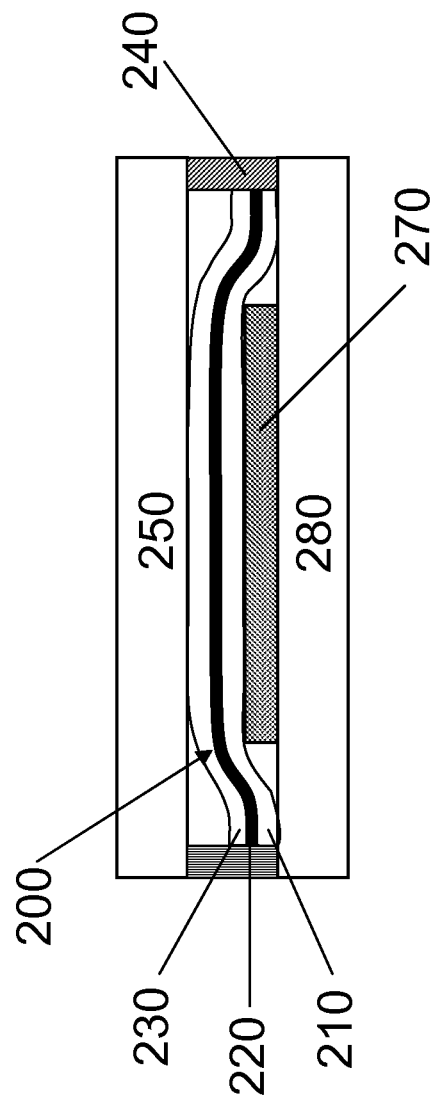
FIG. 2 is a schematic illustration of a hermetically sealed device using a multi-laminate hermetic sheet.

A schematic illustration of a hermetically sealed device is shown in FIG. 2. Device 270 such as an organic light emitting diode (OLED) or thin film solar cell is formed on a hermetic substrate 280 such as a glass substrate. Multi-laminate hermetic sheet 200 comprising an inorganic thin film 220 formed between first and second carrier films 210, 230 is placed over the device. An optional edge-seal 240, such as a dispensed and cured desiccant-filled epoxy, can be formed around the periphery of the hermetic sheet 200. The edge-seal is formed over the substrate and abuts the lateral edge surfaces of one or more of the first carrier film 210, the second carrier film 230, and the inorganic thin film 220 to inhibit lateral diffusion of gases or liquids (e.g., through the first carrier film 210).

An optional protective film or sheet 250 may be formed over the entire structure in order to protect the multi-laminate hermetic sheet 200 from mechanical abrasion, tearing, etc. The protective film 250, in addition to providing a mechanical shield for the multi-laminate sheet 200, can be configured such that the brittle layer (i.e., inorganic thin film 220) is at the neutral plane or within a compressive region of the overall package. Such a configuration can minimize tensile stress to the inorganic thin film during flexing of the package, such as in embodiments where the sheet is handled in a roll-to-roll process.

The process of applying the multi-laminate hermetic sheet to a pre-formed workpiece can be faster than the process of simultaneously forming and depositing an encapsulation layer in situ. A multi-laminate sheet can be applied directly to a device or material in an inert environment at room temperature without the need for vacuum processing. For example, devices that are sensitive to moisture or oxygen can be initially fabricated in a vacuum chamber, removed from the vacuum chamber and placed in an inert environment, and then protected either permanently or temporarily. The ability to apply multi-laminate sheets under conditions of standard temperature and pressure enables short turn-around cycle times (TACT), which contributes to cost-effective processing.

In addition to the foregoing, by decoupling the formation of the multi-laminate sheet from its application to a work-piece, the act of sealing can be compatible with process-sensitive devices such as organic light emitting diodes (OLEDs) or copper indium gallium selenide photovoltaic devices that cannot withstand elevated temperatures or exposure to oxygen. Decoupling the processes enables the use of non-vacuum-based coating processes such as sol-gel, layer-by-layer assembly of nanocomposites, room-temperature sintering of silica nanoparticles, spraying, painting, roll-coating, etc. Other enabled processes include hot pressing low melting temperature glass onto heat-tolerant plastic substrates and tape-casting low-melting temperature glass frit onto a heat-tolerant plastic substrate. The hermetic multi-laminate sheet can be applied to a target workpiece with or without a post-application sintering step.

The multi-laminate hermetic sheet can be used to seal workpieces having planar or non-planar geometries. Advantageously, the hermetic sheet can conform to textured (e.g., non-flat) surfaces such as surfaces containing step features or particulates. By choosing an appropriate combination of films that make up a multi-laminate sheet, hermetic coverage for a variety of surface geometries can be achieved.

In addition to its ability to conform to a non-planar surface, once applied to a workpiece, the multi-laminate hermetic sheet can be mechanically flexible. A mechanically flexible hermetic sheet can bend, bow or otherwise be distorted and retain its hermetic properties. This allows for hermetic sealing of flexible workpieces. According to embodiments, the multi-laminate hermetic sheet can be located at the neutral plane of a sealed device in order to minimize the stress experienced by the inorganic thin film when the device package is flexed. Alternatively, if the device will only be flexed in one direction or laid flat, the multi-laminate sheet can be placed in a compressive region of the assembled structure.

In further embodiments, the multi-laminate hermetic sheet may be optically transparent, which makes it suitable for encapsulating, for example, food items, medical devices, and pharmaceutical materials, where the ability to view the package contents without opening the package may be advantageous. Optical transparency may also be useful in sealing opto-electronic devices such as displays and photo-voltaic devices, which rely on light transmission. In embodiments, the multi-laminate hermetic sheet has an optical transparency characterized by an optical transmittance of greater than 90% (e.g., greater than 90, 92, 94, 96 or 98%).

In one further embodiment, the multi-laminate hermetic sheet can be used to encapsulate a workpiece that contains a liquid or a gas. Example workpieces include dye sensitized solar cells (DSSCs), electro-wetting displays, and electrophoretic displays. The multi-laminate hermetic sheet can substantially inhibit exposure of a workpiece to air and/or moisture, which can advantageously prevent undesired physical and/or chemical reactions such as oxidation, hydration, absorption or adsorption as well as the attendant manifestations of such reactions, including spoilage, degradation, swelling, decreased functionality, etc.

Due to the hermeticity of the multi-laminate sheet, the lifetime of a protected workpiece can be extended beyond that achievable using conventional hermetic barrier layers.

According to various embodiments, one method of forming a free-standing multi-laminate hermetic sheet involves reactively sputtering a metal target with, for example, an effective amount of oxygen gas added to the sputtering gas (e.g., Ar) to produce a hermetic oxide thin film on a polymer substrate.

A further method of forming a multi-laminate hermetic sheet involves non-reactively sputtering 870CHM glass onto a PEN film and then laying a film of polydimethylsiloxane (PDMS) over the exposed surface of the glass. The PDMS thickness can be chosen so as to place the glass film at the neutral plane of the multi-laminate sheet. The PDMS serves as a compliant carrier that allows conformal application of the multi-layer sheet over non-planar or otherwise irregular surfaces. For a multi-laminate sheet having two or more different carrier films, either carrier film can face (e.g., contact) the workpiece.

Additional processes that are suitable for forming the inorganic film on the carrier include chemical vapor deposition, plasma-enhanced chemical vapor deposition, high-rate sputtering such as HIPIMS, and evaporation processes. An additional carrier film can be subsequently formed over the hermetic inorganic thin film. Further layers can be added to a laminate structure individually or as laminate assemblages.

A multi-laminate barrier layer may take the shape of a hermetic sheet as described above, for example, with reference to FIGS. 1 and 2. According to an alternate or complimentary embodiment a multi-laminate barrier layer may take the shape of an O-ring or a flat gasket. As disclosed below in further detail, a multi-laminate barrier gasket comprises a gasket member coated with a hermetic inorganic thin film.

Figure 3:
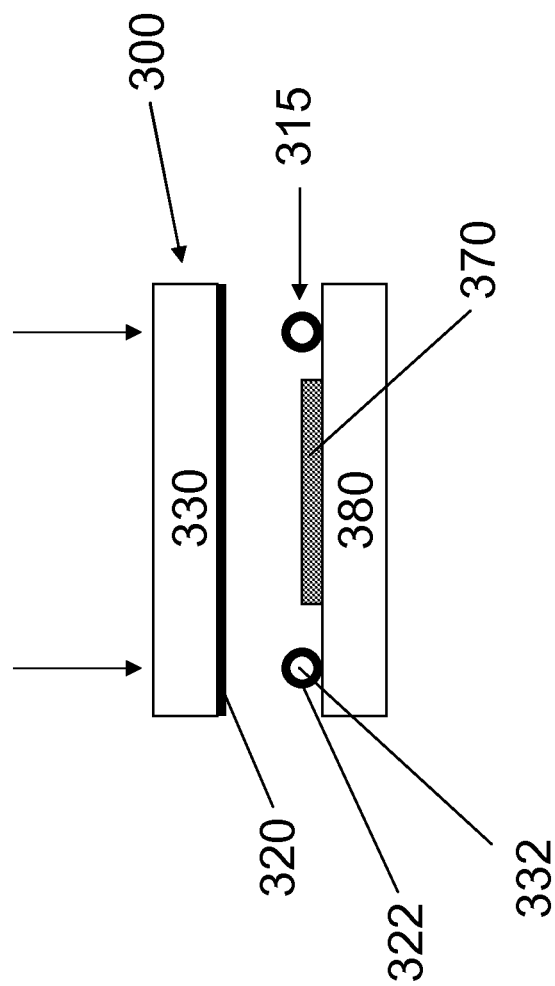
FIG. 3 is a schematic illustration of a method of hermetically sealing a device using a hermetic thin film and a hermetic barrier gasket.

A method of hermetically sealing a workpiece may include applying a peripheral seal, if needed, to prevent moisture or gas intrusion through a carrier film of the multi-laminate sheet. FIG. 3 shows a hermetic sealing configuration comprising a multi-laminate hermetic sheet 300 and a multi-laminate hermetic gasket 315 that cooperate with a substrate 380 to encapsulate a device 370 formed on the substrate. As in the FIG. 1 embodiment, multi-laminate hermetic sheet 300 is configured to be placed over device 370. Prior to covering the device 370 with the laminate sheet 300, a multi-laminate hermetic barrier gasket 315 is positioned on the substrate 380 encircling (i.e., peripheral to) the device. The multi-laminate barrier gasket 315 is a separate component that comprises a gasket member 332 that has been coated with a hermetic inorganic thin film 322. The gasket member can comprise plastics, polymers, or composite films including compliant polymers such as polydimethylsiloxane (PDMS), polyethylene-naphthalate (PEN), or polyethylene-terephthalate (PET), although other commonly used gasket materials such as Viton® or Buna-N (nitrile) O-rings may be suitable.

Still referring to FIG. 3, heat and pressure can be applied locally (as shown by the vertical arrows) around the periphery of the device to form hermetic seals both between the multi-laminate sheet 300 and the gasket 315, and between the gasket 315 and the substrate 380. Thus, the first inorganic thin film can be in hermetic contact with the second inorganic thin film, and the second inorganic thin film can be in hermetic contact with the substrate.

The inorganic film 320 on the laminate hermetic sheet 300 may blanket the entire carrier film 330 if the carrier film is a permeable plastic or, alternatively, if the carrier film is already hermetic (such as standard glass), the inorganic film 320 may be patterned such that it does not cover the device region, but still seals to the barrier gasket 315. Separately, if direct contact between the multi-laminate hermetic sheet and the workpiece needs to be avoided, the multi-laminate sheet can be used as a transparent edge-sealing gasket or an external sealing envelope.

In embodiments, a gasket member is coated with a hermetic inorganic thin film to form a multi-laminate barrier gasket. However, where the gasket member comprises a sufficiently hermetic material, it may be possible to form a hermetic seal using an uncoated gasket member.

Figure 4:
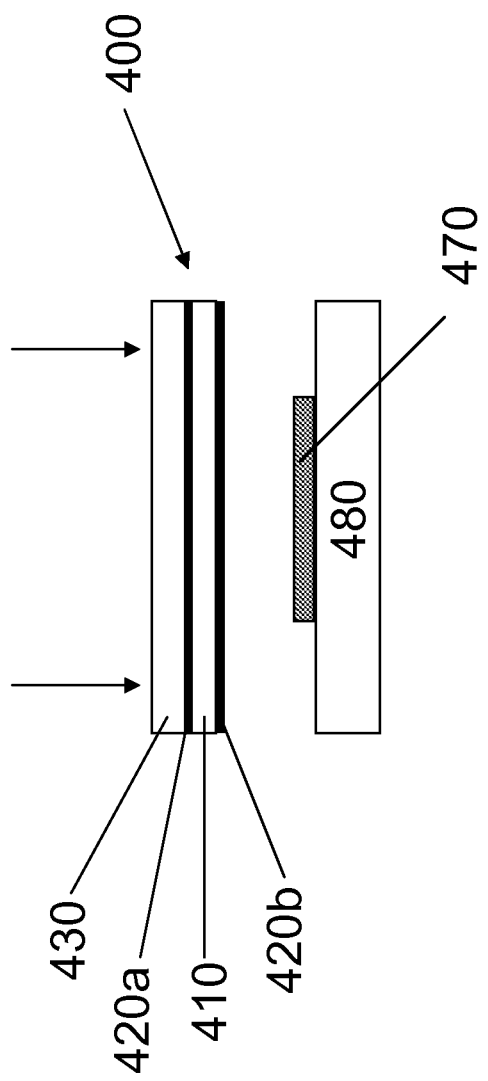
FIG. 4 is a schematic illustration of a method of hermetically sealing a device using a 4-layer hermetic sheet.

A multi-laminate hermetic sheet according to a further embodiment is illustrated schematically in FIG. 4. The multi-laminate hermetic sheet 400 comprises a hermetic inorganic thin film 420a that is formed between a first carrier film 410 and a second carrier film 430, and further comprises a second inorganic thin film 420b that is configured to hermetically contact substrate 480 in a region peripheral to device 470. A hermetic seal can be formed by applying local heat and pressure to the multi-laminate sheet 400 in a region peripheral to the device, as indicated by the vertical arrows. Optionally, as represented by a non-illustrated embodiment, in embodiments where the substrate is not hermetic, an additional hermetic inorganic thin film or multi-laminate hermetic sheet may be formed over the surface of the substrate prior to forming the device on the substrate and covering the device with hermetic sheet 400.

A method of hermetically sealing a workpiece may include covering, placing, laying, laminating, or adhering a multi-laminate hermetic sheet over, onto, or around a workpiece. As used herein, "encapsulate with a multi-laminate hermetic sheet" and variations thereof mean to form an air or liquid tight barrier wholly or partially around a workpiece using the multi-laminate hermetic sheet.

The workpiece can optionally be placed on a substrate and hermetically sealed against or within the substrate. The substrate can comprise a planar substrate or a non-planar substrate. The substrate, which may be formed from a hermetic material, can partially enclose the workpiece to be protected and may comprise, for example, a recessed portion configured to support the workpiece. The substrate may include an inlet or an outlet such as a fill port or a dispensing port through which the workpiece may be passed. In embodiments, the inlet or outlet can be sealed using the laminate hermetic sheet such that an interior of the substrate (as well as its contents) are hermetically isolated from the environment. An example inlet or outlet can comprise a flange. Example substrates include glass or polymer sheets, metal foils, syringes, ampoules, bottles, and other containers. A multi-laminate hermetic sheet can be laid against a surface of such a substrate.

In embodiments, a desiccant material may be sealed together with the workpiece. A desiccant material may be used to scavenge, for example, water. In a further embodiment, the substrate may comprise a location for storing the desiccant, such as a recessed portion within an area that will be sealed. In addition to supporting a workpiece on the substrate, a desiccant material may also be supported on the substrate prior to placing a hermetic sheet over both the workpiece and the desiccant to form an encapsulated workpiece.

A further embodiment of the disclosure relates to a workpiece (e.g., material, article or device) that is protected by the multi-laminate hermetic sheet and/or the multi-laminate barrier gasket. Protected workpieces have the advantage of a longer life due to the hermetic sealing as well as the advantage of being less expensive to produce because of the faster encapsulation TACT.

EXAMPLE

The invention will be further clarified by the following example.

Example 1

Two different multi-laminate hermetic sheets were prepared from about 125 micron thick polyethylene-naphthalate (PEN) plastic that was coated with about 2 microns of 870CHM material. Sample 1 comprised as-deposited CHM-coated PEN plastic, while Sample 2 comprised CHM-coated PEN plastic that was sintered at 140° C. for 2 hr. A comparative Sample 3 comprised un-coated PEN plastic.

Test packets were formed by stacking two such sheets together and sealing around the periphery using an impulse sealer set to a temperature effective to form a seal. Prior to completely sealing the sheets together, Drierite™ material (calcium sulfate) was inserted into each packet as an indicator for when sufficient moisture had diffused into the packet to induce a color change in the Drierite™ from blue to pink. After 90 hrs in ambient humidity, the Drierite™ in comparative Sample 3 was pink, indicating that moisture had penetrated the packet. On the other hand, the content of both Sample 1 and Sample 2 was blue, indicating that an effective hermetic barrier was encapsulating the Drierite™.

Disclosed are a novel product and process for hermetically sealing a device or article without the need to maintain compatibility between the workpiece being protected and the processes for both forming and depositing the encapsulating barrier. The disclosed free-standing multi-laminate hermetic barriers and attendant encapsulation methods may be used to protect a device during its manufacture. Also, the barriers and methods may be used to protect a device temporarily or permanently during its use.

As used herein, the singular forms "a," "an" and "the" include plural referents unless the context clearly dictates otherwise. Thus, for example, reference to a "sheet" includes examples having two or more such "sheets" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A protected substrate comprising:
   an hermetic structure formed over a major surface of a substrate,
   wherein the hermetic structure comprises a barrier layer in direct physical contact with a film,
   wherein the barrier layer comprises a glass material selected from the group consisting of a tin fluorophosphate glass, a tungsten-doped tin fluorophosphate glass, a chalcogenide glass, a tellurite glass, and a borate glass and the film comprises a polymer layer,
   wherein the tin fluorophosphate glass comprises 20-85 wt % Sn, 2-20 wt % P, 10-36 wt % O, 10-36 wt % F, 0-5 wt % Nb, and at least 75 wt % total of Sn+P+O+F, and
   wherein the tungsten-doped tin fluorophosphate glass comprises 55-75 wt % Sn, 4-14 wt % P, 6-24 wt % O, 4-22 wt % F, and 0.15-15 wt % W.

2. The protected substrate according to claim 1, wherein from two or more hermetic structures are formed over the substrate.

3. The protected substrate according to claim 2, wherein a first major surface of the film is in direct physical contact with the barrier layer and an opposing second major surface of the film is in contact with a second barrier layer comprising a glass material selected from the group consisting of a tin fluorophosphate glass, a tungsten-doped tin fluorophosphate glass, a chalcogenide glass, a tellurite glass, a borate glass and a phosphate glass.

4. The protected substrate according to claim 1, wherein the barrier layer or film is in physical contact with the substrate.

5. The protected substrate according to claim 1, wherein the barrier layer, the film or both the barrier layer and film have an average thickness of less than about 50 microns.

6. The protected substrate according to claim 1, wherein the film comprises a polymer selected from the group consisting of polydimethylsiloxane, polyethylene naphthalate, and polyethylene terephthalate.

7. The protected substrate according to claim 1, wherein the hermetic structure is optically translucent.

8. The protected substrate according to claim 1, wherein the substrate comprises gallium nitride.

9. The protected substrate according to claim 1, wherein the barrier layer has an average thickness ranging from about 0.5 to about 10 microns.

10. A protected substrate comprising:
   an hermetic structure formed over a major surface of a substrate,
   wherein the hermetic structure comprises a barrier layer in direct physical contact with a film, and
   wherein the barrier layer comprises a glass material selected from the group consisting of a tin fluorophosphate glass, a tungsten-doped tin fluorophosphate glass, a chalcogenide glass, a tellurite glass, a borate glass and a phosphate glass, and
   wherein the film comprises a polymer selected from the group consisting of polydimethylsiloxane, polyethylene naphthalate, and polyethylene terephthalate.

* * * * *

UNITED STATES PATENT AND TRADEMARK OFFICE
CERTIFICATE OF CORRECTION

PATENT NO. : 9,555,595 B2
APPLICATION NO. : 14/032663
DATED : January 31, 2017
INVENTOR(S) : Victoria Ann Edwards et al.

Page 1 of 1

It is certified that error appears in the above-identified patent and that said Letters Patent is hereby corrected as shown below:

On the Title Page

Inventor: Shari Elizabeth Koval, Beaver Dreams, NY should read Shari Elizabeth Koval, Beaver Dams, NY Signed and Sealed this
Third Day of October, 2017

Joseph Matal
*Performing the Functions and Duties of the*
*Under Secretary of Commerce for Intellectual Property and*
*Director of the United States Patent and Trademark Office*